(12) United States Patent
Granneman et al.

(10) Patent No.: US 11,339,474 B2
(45) Date of Patent: May 24, 2022

(54) ATOMIC LAYER DEPOSITION APPARATUS AND METHOD FOR PROCESSING SUBSTRATES USING AN APPARATUS

(71) Applicant: ASM International N.V., Almere (NL)

(72) Inventors: Ernst Hendrik August Granneman, Almere (NL); Leilei Hu, Almere (NL)

(73) Assignee: ASM International N.V., Almere (NL)

( * ) Notice: Subject to any disclaimer, the term of this patent is extended or adjusted under 35 U.S.C. 154(b) by 89 days.

(21) Appl. No.: 16/833,937

(22) Filed: Mar. 30, 2020

(65) Prior Publication Data

US 2020/0263300 A1 Aug. 20, 2020

Related U.S. Application Data

(62) Division of application No. 15/322,653, filed as application No. PCT/NL2015/050767 on Nov. 3, 2015, now Pat. No. 10,648,078.

(30) Foreign Application Priority Data

Nov. 4, 2014 (NL) ..................................... 2013739

(51) Int. Cl.
*C23C 16/455* (2006.01)
*C23C 16/44* (2006.01)
(Continued)

(52) U.S. Cl.
CPC .... *C23C 16/45548* (2013.01); *C23C 16/4401* (2013.01); *C23C 16/4408* (2013.01); *C23C 16/455* (2013.01); *C23C 16/4583* (2013.01); *C23C 16/45578* (2013.01); *C23C 16/54* (2013.01); *H01L 21/6776* (2013.01); *H01L 21/67784* (2013.01); *C23C 16/45525* (2013.01); *H01J 37/3244* (2013.01)

(58) Field of Classification Search
CPC ............................ C23C 16/54; C23C 16/4583
See application file for complete search history.

(56) References Cited

U.S. PATENT DOCUMENTS 5,136,975 A * 8/1992 Bartholomew ... C23C 16/45514
118/715
2009/0291209 A1* 11/2009 Granneman ...... H01L 21/67784
427/255.5

(Continued)

*Primary Examiner* — Joseph A Miller, Jr.
(74) *Attorney, Agent, or Firm* — Preti Flaherty Beliveau & Pachios LLP

(57) ABSTRACT

An atomic layer deposition apparatus, having a first series of high pressure gas injection openings and a first series of exhaust openings that are positioned such that they together create a first high pressure/suction zone within each purge gas zone, wherein each first high pressure/suction zone extends over substantially the entire width of the process tunnel and wherein the distribution of the gas injection openings that are connected to the second purge gas source and the distribution of the gas exhaust openings within the first high pressure/suction zone, as well as the pressure of the second purge gas source and the pressure at the gas exhaust openings are such that the average pressure within the first high pressure/suction zone deviates less than 30% from a reference pressure which is defined by the average pressure within process tunnel when no substrate is present.

6 Claims, 12 Drawing Sheets

(51) Int. Cl.
   *C23C 16/458*    (2006.01)
   *H01L 21/677*    (2006.01)
   *C23C 16/54*     (2006.01)
   *H01J 37/32*     (2006.01)

(56) References Cited

U.S. PATENT DOCUMENTS

2012/0225191 A1\* 9/2012 Yudovsky ......... C23C 16/45551
                                                    427/58
2013/0199448 A1\* 8/2013 Granneman ........... B65G 51/02
                                                   118/729

\* cited by examiner

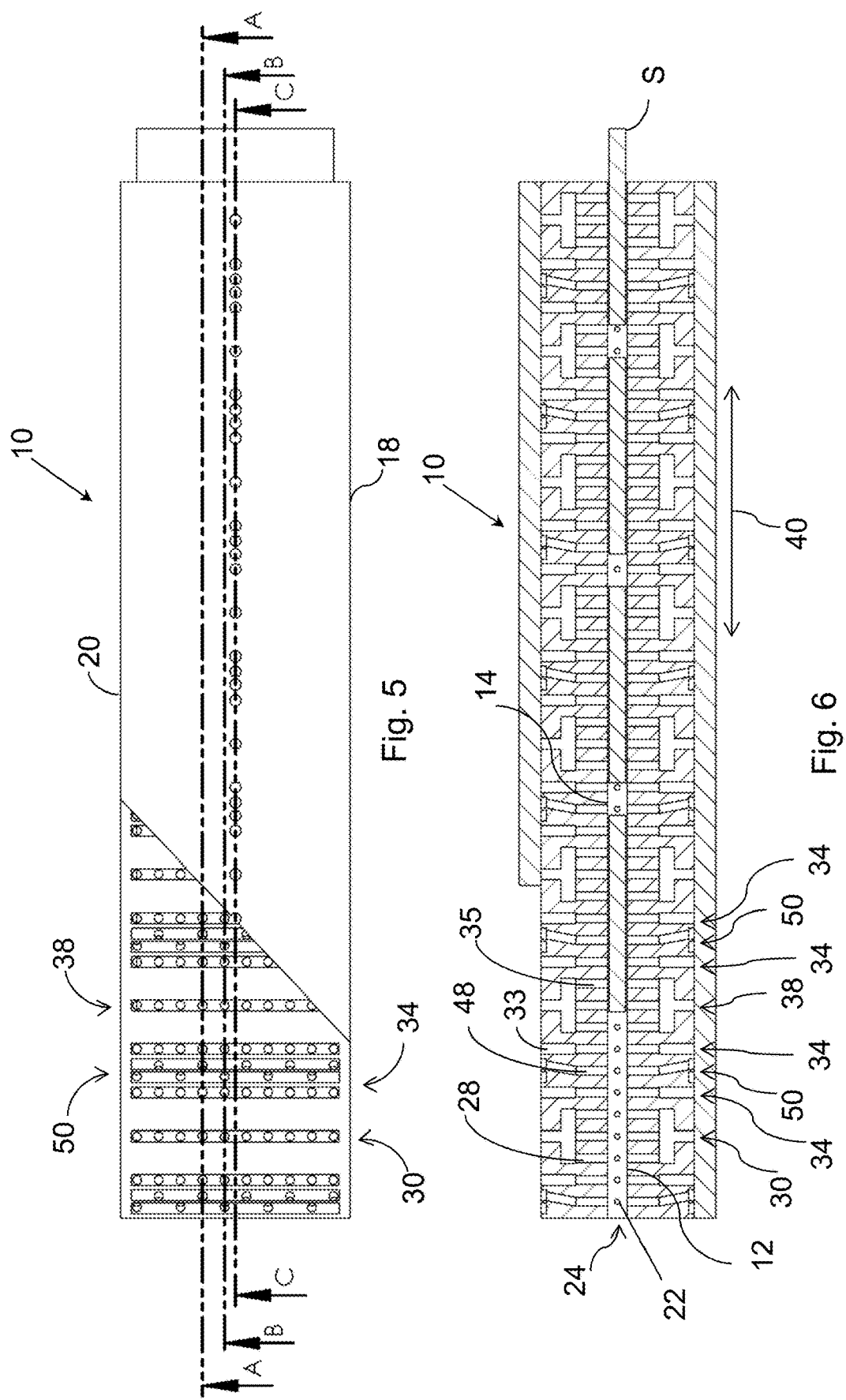

ATOMIC LAYER DEPOSITION APPARATUS AND METHOD FOR PROCESSING SUBSTRATES USING AN APPARATUS

FIELD

The invention relates to the field of atomic layer deposition (ALD) and, more specifically, to an atomic layer deposition apparatus.

BACKGROUND

Atomic layer deposition apparatus are known from, for example, WO2009/142487 and WO2012/005577. WO2009/142487 discloses an atomic layer deposition apparatus for continuous processing of semiconductor substrates, wherein the substrates are supported by gas bearings. The disclosed apparatus comprises a process tunnel that extends in a longitudinal direction and that is bounded by at least two walls. The walls are mutually parallel and spaced apart, so that a substantially flat substrate may be accommodated parallel between them. The walls of the process tunnel are provided with a plurality of gas injection channels to provide the gas bearings to floatingly support the substrate in the process tunnel.

The gas injection channels in at least one of the first and second walls are successively connected to a first precursor gas source, a purge gas source, a second precursor gas source, and a purge gas respectively. The successively connected gas injection channels create an atomic layer deposition-segment that—in use—comprises successive zones including a first precursor gas, and purge gas, a second precursor gas and a purge gas, respectively. At least two of such tunnel segments are disposed in succession in the transport direction as can be seen in FIG. 1. The segments form an atomic layer deposition apparatus for successively applying layers of chemically deposited precursor reaction products. In order to provide the forward movement to the substrate that is required for continuous processing, the apparatus is provided with a downwardly sloping process tunnel. The downward slope enables gravity to drive the floatingly supported substrates through the successive segments, causing atomic layers to be deposited on the substrates during transportation through the process tunnel in a transport direction.

The (forward) movement of these substrates in a transport direction, especially at higher velocities, may cause a fraction of the precursor gas used in a first precursor zone to be pushed or dragged forwardly, thereby traversing a downstream purge gas zone into a second precursor zone, causing mixing of the precursor gases from both zones. Since the precursor gases are mutually reactive, such mixing results in unwanted chemical vapor deposition in the process tunnel. This may, for example, lead to clogging of the gas injection openings and lateral gas exhaust openings in the deposition and purge gas zones of the process tunnel. A relatively high amount of maintenance and cleaning time is required to remove the depositions in the segments of the process tunnel. This in turn leads to a (significant) negative impact on the uptime of the apparatus and consequently, a reduced production capacity.

The traversal of the precursor gases originates from two sources. First of all, the gas disposed in a segment in front of the substrate is displaced in the transport direction by the moving substrate. The displacement causes the gas to traverse from a (first) precursor zone through a purge gas zone into an adjacent, successive (second) precursor gas zone of the process tunnel. An example of such traversal effect is provided in FIG. 2, which shows a schematic view of water vapor ($H_2O$)—being a precursor gas—traversing the nitrogen ($N_2$)-purge gas zone ($+1N_2$, $+2N_2$, $+3N_2$) into the tri-methyl aluminum (TMA)-precursor gas zone.

Secondly, the presence of a substrate in the process tunnel produces a high pressure region above and below the substrate compared to the open region in the process tunnel between the substrates. The resulting pressure gradient causes a flow of gas from the relatively high-pressure regions to the relatively low-pressure regions in front of and behind the substrate. Consequently, a gas flow into the adjacent segments of the process tunnel may be created, which is caused by the presence of a substrate. Consequently, the high and low pressure region 'travel' along with the movement of the substrate. The resulting gas flow, for example comprised of precursor gas injected in a first precursor gas injection zone may under influence of the pressure gradient traverse the purge gas zone into a second precursor gas zone. An example thereof is shown in FIG. 3.

As a result of the abovementioned causes, at least part of a precursor gas may traverse the purge gas zone to subsequently mix with a second, different precursor gas in a second precursor zone.

SUMMARY OF THE INVENTION

An object of the invention is therefore to provide an atomic layer deposition apparatus that substantially prevents different precursor gases from mixing with each other, while still allowing a relatively high transport velocity of the substrates. To that end, the invention provides an atomic layer deposition apparatus, comprising:
  a lower wall including a plurality of gas injection openings;
  an upper wall extending parallel to the lower wall including a plurality of gas injection openings;
  a first and a second side wall extending substantially perpendicularly relative to the lower wall;
  a plurality of gas exhaust openings;
  wherein the lower wall, the upper wall and the first and the second side walls bound a process tunnel having a length extending in a transport direction and having a width extending transversely to the transport direction and defining a vertical middle plane that is positioned centrally between the first and the second side wall;
  the apparatus additionally including:
  a first precursor gas source connected to series of gas injection openings of the plurality of gas injection openings so as to create first precursor gas injection zones that extend over substantially the entire width of the process tunnel and that are spatially arranged along the transport direction of the process tunnel;
  a purge gas source connected to series of gas injection openings of the plurality of gas injection openings so as to create purge gas injection zones that extend over substantially the entire width of the process tunnel and that are spatially arranged along the transport direction of the process tunnel;
  a second precursor gas source connected to series of gas injection openings of the plurality of gas injection openings so as to create second precursor gas injection zones that extend over substantially the entire width of the process tunnel and that are spatially arranged along the transport direction of the process tunnel;
  wherein the connections of the first precursor gas source, the purge gas source and the second precursor gas source to the respective gas injection openings are such that a plurality of successive process sections is created in the process tunnel along the transport direction, wherein each process section includes successively a first precursor gas injection zone, a purge gas zone, a second precursor gas injection zone, and a purge gas zone;

the apparatus additionally including:
wherein
the distribution of the gas injection openings in the lower wall and the upper wall;
a ratio between a thickness of a substrate to be processed and a distance between the lower wall and the upper wall;
the supply of gas through the gas injection openings; and
the exhaust of gas through the gas exhaust openings are such that, in use:
  gas bearings are formed above and below a substrate that is present in the process tunnel; and
  within each first precursor gas zone, each purge gas zone and each second precursor gas zone two opposite lateral flows of gas exist that are substantially perpendicularly to the transport direction and that flow from the vertical middle plane of the tunnel in the direction of respectively the first and the second side wall;
characterized by
  a second purge gas source of which the pressure is higher than the first purge gas source;
  a first series of high pressure gas injection openings 46 in at least one of the upper and the lower wall, which first series of high pressure gas injection openings is positioned within each purge gas zone over substantially the entire width of the process tunnel and that is connected to the second purge gas source; and
  wherein the gas exhaust openings include a first series of gas exhaust openings that is provided in at least one of the upper and the lower wall and that is distributed over substantially the entire width of the process tunnel and that is connected to a gas exhaust channel;
  wherein the first series of high pressure gas injection openings and the first series of gas exhaust openings are positioned such that they together create a first high pressure/suction zone within each purge gas zone, wherein each first high pressure/suction zone extends over substantially the entire width of the process tunnel; and
  wherein the distribution of the gas injection openings that are connected to the second purge gas source and the distribution of the gas exhaust openings of the first series of gas exhaust openings within each first high pressure/suction zone, as well as the pressure of the second purge gas source and the pressure at the gas exhaust openings are such that the average pressure within each first high pressure/suction zone deviates less than 30%, preferably less than 10%, and preferably less than 5%, from a reference pressure which is defined by the average pressure within the first precursor gas zones, the second precursor gas zones and the purge gas zones when no substrate is present.

An advantage of the atomic layer apparatus according to the invention is that the high pressure/suction zone in each purge gas zone substantially prevents precursor gases from traversing the purge gas zone in either direction. Consequently, mixing of the precursor gases from both precursor gas zones and resulting unwanted chemical vapor deposition in the process tunnel are substantially prevented as well.

The high pressure/suction zone in each purge gas zone, formed by the positioning of the first series of high pressure gas injection openings and the first series of exhaust openings, may substantially block precursor gas from flowing through the purge gas zone in the transport direction. The blocking effect is mainly caused by the relatively high pressure with which gas is injected through the high pressure gas injection openings in the high pressure/suction zone. Instead of traversing the purge gas zone, the flow of precursor gas is directed laterally to an exhaust opening of the first series of gas exhaust openings. Consequently, the precursor gas flow from a first precursor gas zone will substantially be removed from the process tunnel through the exhaust openings before it can reach enter a second precursor gas zone.

Simulations show that with an atomic layer deposition apparatus according to the invention the amount of precursor gas, which may for example be expressed in a mass fraction of precursor gas, traversing a purge gas zone into a neighboring precursor gas zone may be reduced with a factor 100 compared with an apparatus in the prior art.

Moreover, the reduction effect may also be observed at relatively high velocities (i.e. >0.1 m/s) of the substrate in the process tunnel. This allows for a relatively high processing speed of the substrates, while still preventing the mixing of precursor gases.

Because the average pressure within each high pressure/suction zone deviates less than 30%, preferably less than 10%, and preferably less than 5%, from a reference pressure, which is defined by the average pressure within the first precursor gas zones, the second precursor gas zones and the purge gas zones when no substrate is present, the forward movement of the substrate in the transport direction is not, or virtually not impacted by the presence of the high pressure/suction zone. In the situation that the high pressure/suction zone would solely consists of high pressure gas injection openings, the zone would impair the movement of the substrates in the transport direction. The positioning of the first series of high pressure gas injection openings and the first series of gas exhaust openings in the high pressure/suction zone may therefore be such that along a line transverse to the transport direction an alternating pattern of high and low pressure is created.

The present invention additionally relates to a substrate processing apparatus, which may be, but does not have to be an atomic layer deposition apparatus.

To that end, the invention provides a substrate processing apparatus, comprising:
  a lower wall including a plurality of gas injection openings;
  an upper wall extending parallel to the lower wall including a plurality of gas injection openings;
  a first and a second side wall extending substantially perpendicularly relative to the lower wall;
  wherein the lower wall, the upper wall and the first and the second side walls bound a process tunnel having a length extending in a transport direction and having a width extending transversally to the transport to the transport direction and defining a longitudinal axis extending in a vertical middle plane that is positioned centrally between the side walls and extending in a horizontal middle plane that is positioned centrally between the lower and the upper wall;
  the apparatus additionally including:
  a gas source connected to the gas injection openings;
  a plurality of gas exhaust openings that are arranged in the lower wall and the upper wall;
  an exhaust channel that is in fluid connection with the gas exhaust openings;

wherein
 the distribution of the gas injection openings in the lower wall and the upper wall,
 the distribution of the gas exhaust openings in the lower wall and/or the upper wall,
 a ratio between a thickness of a substrate to be processed and a distance between the lower wall and the upper wall,
 the supply of gas through the gas injection openings, and
 the exhaust of gas through the exhaust openings
are such that, in use gas bearings are formed above and below a substrate that is present in the process tunnel; and
 wherein in the upper wall and/or the lower wall the plurality of gas injection openings includes subsets of gas injection openings, wherein each subset is positioned on a line having a length and a thickness, wherein the line extends along a direction that includes an angle α with the transport direction between 0° and 90°, wherein the plurality of gas exhaust openings includes subsets of gas exhaust openings, wherein with each subset of gas injection openings a subset gas exhaust openings is associated, wherein the gas exhaust openings of that subset are positioned on the line on which the gas injection openings of the associated gas injection opening subset are positioned and wherein the gas exhaust openings are intermittently positioned between the gas injection openings, such that, in use, the gases flowing from the gas injection openings to the adjacent gas exhaust openings of the same subset exert a drag force on the substrate resulting in a forward movement and/or rotation movement of the substrate.

The apparatus according to this aspect has the advantage that it provides a simple means for transporting the substrates in the transport direction and/or for rotating the substrates while being processed. A subset of gas injection openings and an associated subset of gas exhaust openings, being positioned on a line SL may provide a forward motion to a substrate accommodated in the process tunnel.

By providing the subsets of gas injection openings and gas exhaust opening on a line that includes an angle α to the transport direction which is between 0°-90°, the flow of injected gas is provided with both a lateral component perpendicular to the transport direction, as well as with a component in and/or opposite to the transport direction. As a result, a drag force in and/or opposite the transport direction is exerted on the substrate, providing a forward/backward movement and/or a rotational movement to that substrate. The line may have a certain thickness so that the centers of the gas injection openings and the centers of the gas exhaust openings do not all have to be exactly on a mathematical line. The line may have a thickness in the order of some millimeters for example 0-4 mm and consequently, the centers gas injection openings and the gas exhaust openings may be positioned somewhat staggered relative to each other as long as they are positioned within the thickness of the line SL. The speed of the movement provided to the substrate depends, among others, on the angle α, the injection pressure used to inject gas through the subset of gas injection openings, the pressure at the gas exhaust openings, and the characteristics of the substrate. As such, the apparatus according to the invention may be used for transporting and/or rotating substrates in a way that is not present in the prior art.

In addition, the apparatus according to the invention has the advantage that a variety of differently shaped substrates may be processed in the apparatus. This does not only relate to a geometric shape of a substrate, but also to the thickness of a substrate. The driving effect provided by the present invention may be used with a variety of geometrically shaped substrates, wherein the drive system may be adapted for that specific geometric shape. The adaptations may for example concern the angle of the line on which each subset is positioned, but may also concern the spacing of the gas injection and gas exhaust openings on such a line as well as the length of each line. Additionally to that feature, the present invention may also be used to process substrates of various thicknesses.

The invention also provides a method for depositing a layer on a substrate, the method comprising:
 providing an atomic layer deposition apparatus according to the any one of claims 1-10 and 15;
 providing at least one substrate;
 injecting gas in the process tunnel through the gas injection openings;
 introducing the at least one substrate in the process tunnel, wherein gas bearings are formed above and below the substrate;
 subjecting at least one surface of the substrate to an atomic layer treatment, by:
  injecting a first precursor gas into the first precursor gas zones to deposit a first layer on the substrate,
  injecting a second precursor gas into the second precursor gas zones to deposit a second layer on the substrate,
  injecting purge gas into each purge gas zone using the series of high pressure gas injection openings while simultaneously exhausting gas from the process tunnel through the first series of gas exhaust openings, forming a first high pressure/suction zone that extends over substantially the entire width of the process tunnel, the first high pressure/suction zone substantially preventing the first precursor gas from the first precursor gas zone from traversing the adjacent purge gas zone into the second precursor gas zone, and simultaneously preventing the second precursor gas from the second precursor gas zone from traversing the purge gas zone into the first precursor gas zone, and
 controlling a pressure of:
  the first precursor gas source,
  the purge gas source,
  the second precursor gas source, and
  the second purge gas source; and
 controlling a pressure at the gas exhaust openings, such that an average pressure within each first high pressure/suction zone deviates less than 30%, preferably less than 10%, and preferably less than 5%, from a reference pressure which is defined by the average pressure within the first precursor gas zones, the second precursor gas zones and the purge gas zones when no substrate is present.

The method according to the invention provides an improved separation of precursor gases between various precursor gas zones. The improved separation is provided by the high pressure/suction zone, which substantially prevents a first precursor gas from the first precursor gas zone from traversing the adjacent purge gas zone into the second precursor gas zone, and simultaneously preventing the second precursor gas from the second precursor gas zone from traversing the purge gas zone into the first precursor gas zone.

The invention furthermore comprises a method for processing substrates in a substrate processing apparatus, the method comprising:

providing a substrate processing apparatus according to any one of claims 11-15;
providing at least one substrate;
injecting gas in the process tunnel through the gas injection openings;
introducing the at least one substrate in the process tunnel, wherein gas bearings are formed above and below the substrate;
injecting gas in the process tunnel through the subsets of gas injection openings and simultaneously exhausting gas from the associated subsets of gas exhaust openings to transport the substrate in the transport direction and/or provide a rotation of the substrate.

The method according to the invention provides an improved alternative method for transporting and/or rotating substrates within a process tunnel. An advantage of the method may be that a substrate may be propelled forward through the process tunnel in the transport direction, while simultaneously being provided with a rotation to provide a more uniform processing of the surface or surfaces of the substrate.

Various embodiments are claimed in the dependent claims, which will be further elucidated with reference to some examples shown in the figures. The embodiments may be combined or may be applied separate from each other.

BRIEF DESCRIPTION OF THE FIGURES

FIG. 5 shows schematic top plan view of the apparatus of FIG. 4;
FIG. 6 shows a cross-section along the line A-A of FIG. 5.

DETAILED DESCRIPTION OF THE FIGURES

Figure 1:
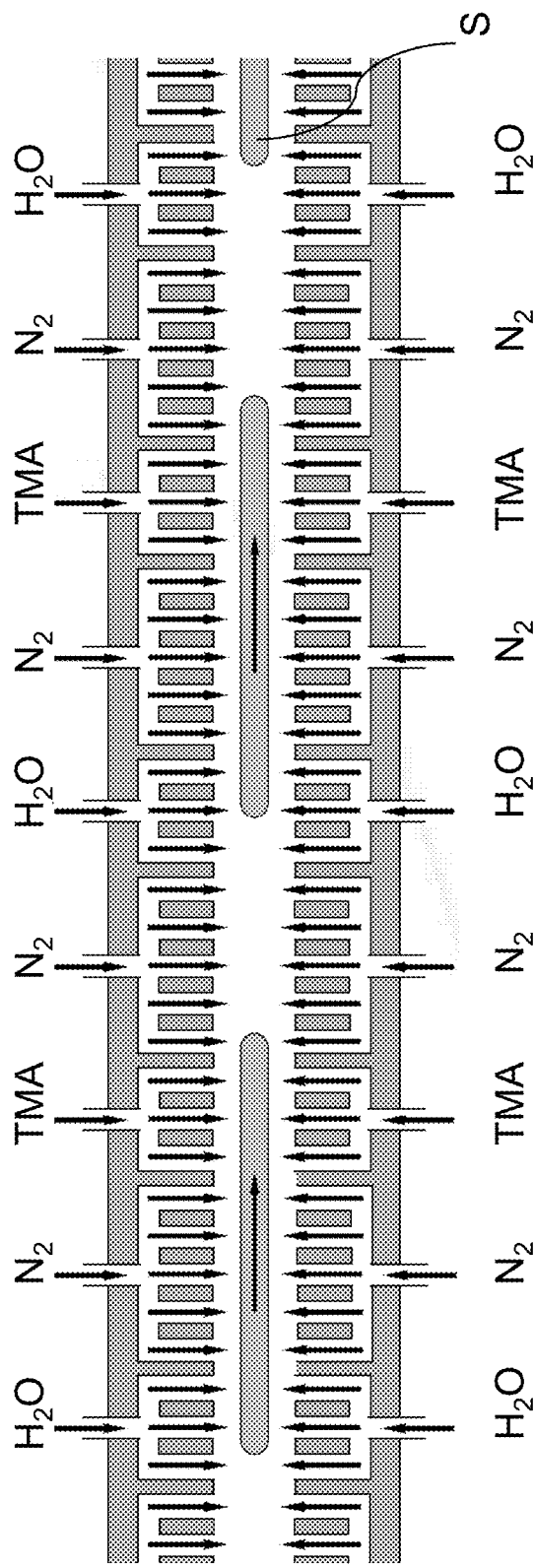
FIG. 1 is a vertical cross-section of an atomic layer deposition apparatus according to the prior art.

In this application similar or corresponding features are denoted by similar or corresponding reference signs. The description of the various embodiments is not limited to the examples shown in the figures and the reference number used in the detailed description and the claims are not intended to limit the description of the embodiments, but are included to elucidate the embodiments by referring to the examples shown in the figures.

FIGS. 4-10 show various examples of atomic layer deposition apparatus in which various embodiments including the first main aspect of the invention are present.

In the most general terms, according to the first aspect of the disclosure, an atomic layer deposition apparatus is provided that comprises:
a lower wall 12 including a plurality of gas injection openings 16;
an upper wall 14 extending parallel to the lower wall 12 and including a plurality of gas injection openings 16;
a first 18 and a second 20 side wall extending substantially perpendicularly relative to the lower wall 12; and
a plurality of gas exhaust openings.

The lower wall 12, the upper wall 14 and the first 18 and the second 20 side walls bound a process tunnel 24 having a length extending in a transport direction T and having a width W extending transversally to the transport direction T and defining a vertical middle plane that is positioned centrally between the first 18 and the second 20 side wall.

The atomic layer deposition apparatus 10 additionally includes:
a first precursor gas source 26 connected to series of gas injection openings 28 of the plurality of gas injection openings 16 so as to create first precursor gas injection zones 30 that extend over substantially the entire width W of the process tunnel and that are spatially arranged along the transport direction T of the process tunnel 24;
a purge gas source 32 connected to series of gas injection openings 33 of the plurality of gas injection openings 16 so as to create purge gas injection zones 34 that extend over substantially the entire width W of the process tunnel 24 and that are spatially arranged along the transport direction T of the process tunnel 24; and
a second precursor gas source 36 connected to series of gas injection openings 35 of the plurality of gas injection openings 16 so as to create second precursor gas injection zones 38 that extend over substantially the entire width W of the process tunnel 24 and that are spatially arranged along the transport direction T of the process tunnel 24.

The connections of the first precursor gas source 26, the purge gas source 32 and the second precursor gas source 36 to the respective gas injection openings 16 are such that a plurality of successive process sections 40 is created in the process tunnel 24 along the transport direction T. Each process section 40 includes successively a first precursor gas injection zone 30, a purge gas zone 34, a second precursor gas injection zone 38, and a purge gas zone 34.

In the atomic layer deposition apparatus
the distribution of the gas injection openings 16 in the lower wall 12 and the upper wall 14;

a ratio between a thickness of a substrate S to be processed and a distance D between the lower wall 12 and the upper wall 14;

the supply of gas through the gas injection openings 16; and the exhaust of gas through the gas exhaust openings; are such that, in use:

gas bearings are formed above and below a substrate S that is present in the process tunnel 24; and within each first precursor gas zone 30, each purge gas zone 34 and each second precursor gas zone 38 two opposite lateral flows of gas exist that are substantially perpendicularly to the transport direction T and that flow from the vertical middle plane of the tunnel 24 in the direction of respectively the first 18 and second 20 side wall;

The atomic layer deposition apparatus additionally includes:

a second purge gas source 44 of which the pressure is higher than the first purge gas source 32;

a first series of high pressure gas injection openings 46 in at least one of the upper 14 and the lower wall 12, which first series of high pressure gas injection openings 46 is positioned within each purge gas zone 34 over substantially the entire width W of the process tunnel 24 and that is connected to the second purge gas source 44.

The gas exhaust openings of the atomic layer deposition apparatus include at least:

a first series of gas exhaust openings 48 that is provided in at least one of the upper 14 and the lower wall 12 and that is distributed over substantially the entire width W of the process tunnel 24 and that is connected to a gas exhaust channel 49.

The first series of high pressure gas injection openings 46 and the first series of gas exhaust openings 48 are positioned such that they together create a first high pressure/suction zone 50 within each purge gas zone 34. Each first high pressure/suction zone 50 extends over substantially the entire width W of the process tunnel 24. The distribution of the gas injection openings 46 that are connected to the second purge gas source 44 and the distribution of the gas exhaust openings 48 of the first series of gas exhaust openings within each first high pressure/suction zone 50, as well as the pressure of the second purge gas source 44 and the pressure at the gas exhaust openings 48 are such that the average pressure within each first high pressure/suction zone 50 deviates less than 30%, preferably less than 10%, and preferably less than 5%, from a reference pressure which is defined by the average pressure within the first precursor gas zones 30, the second precursor gas zones 38 and the purge gas zones 34 when no substrate is present.

Figure 2:
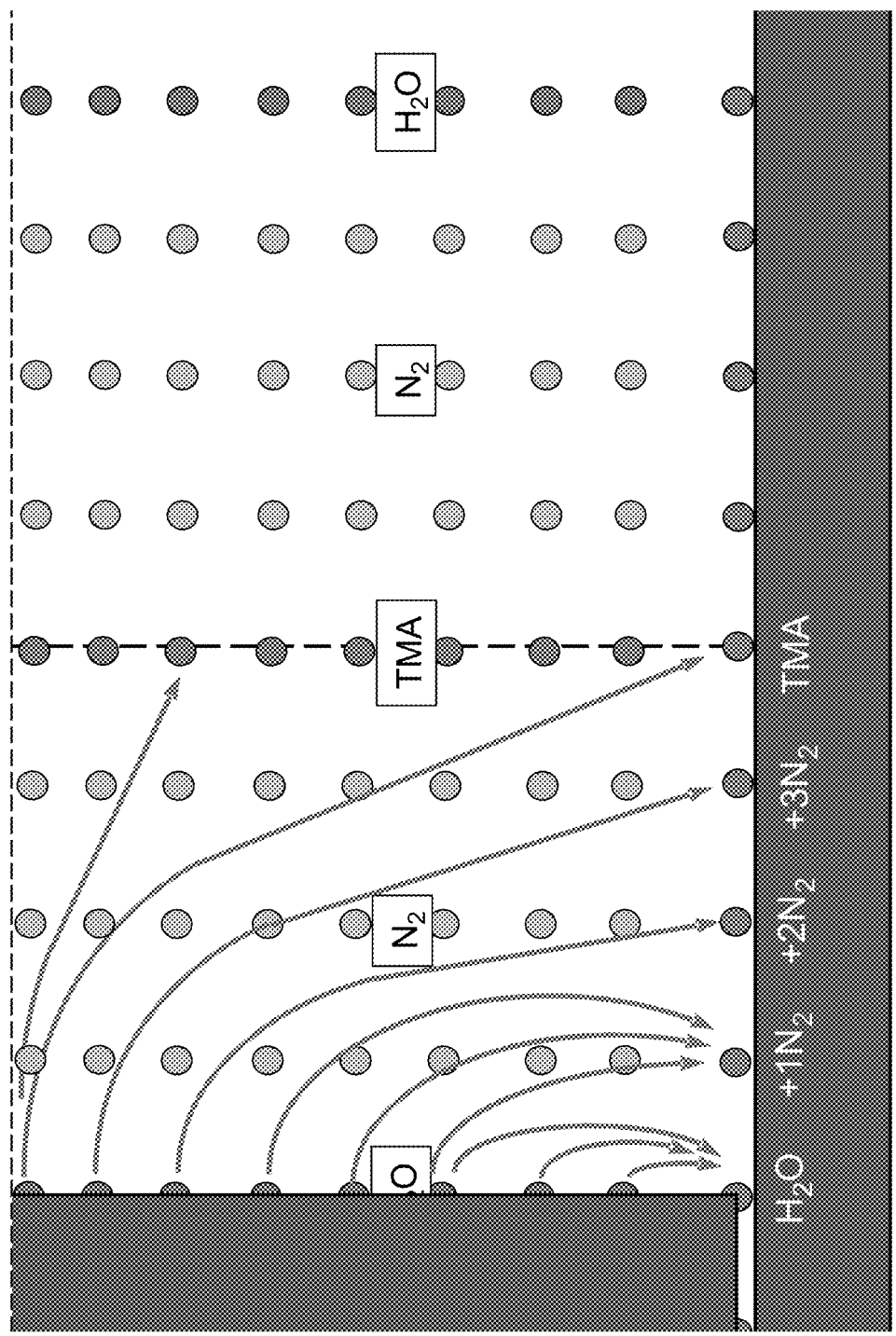
FIG. 2 shows a schematic top plan view of a flow of precursor gas that is pushed into the transport direction by a forwardly moving substrate that is present in an apparatus according to the prior art.
Figure 3:
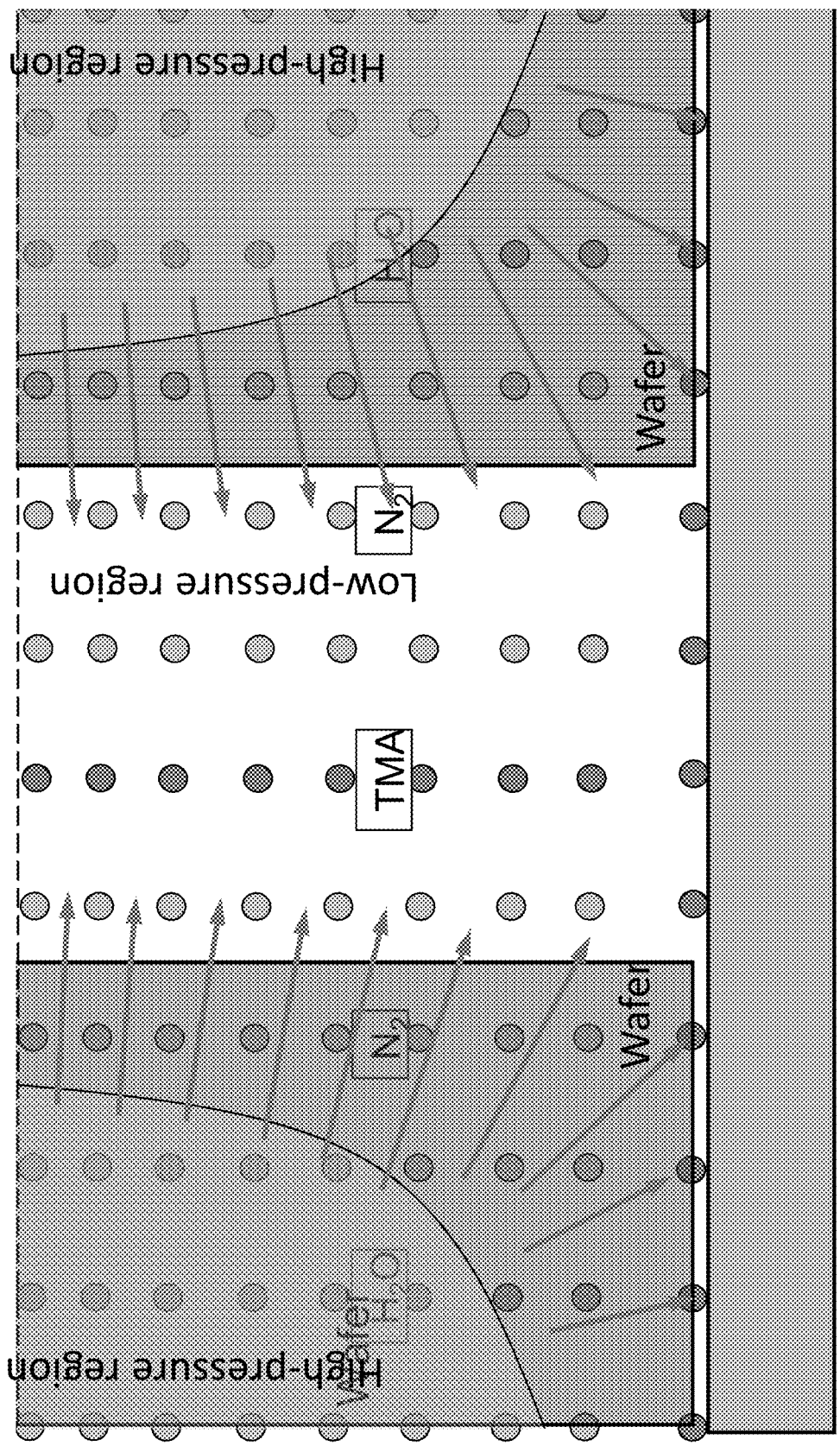
FIG. 3 shows a schematic top plan view of high pressure and low pressure regions created by the presence of substrates in a process tunnel in an apparatus according to the prior art.
Figure 4:
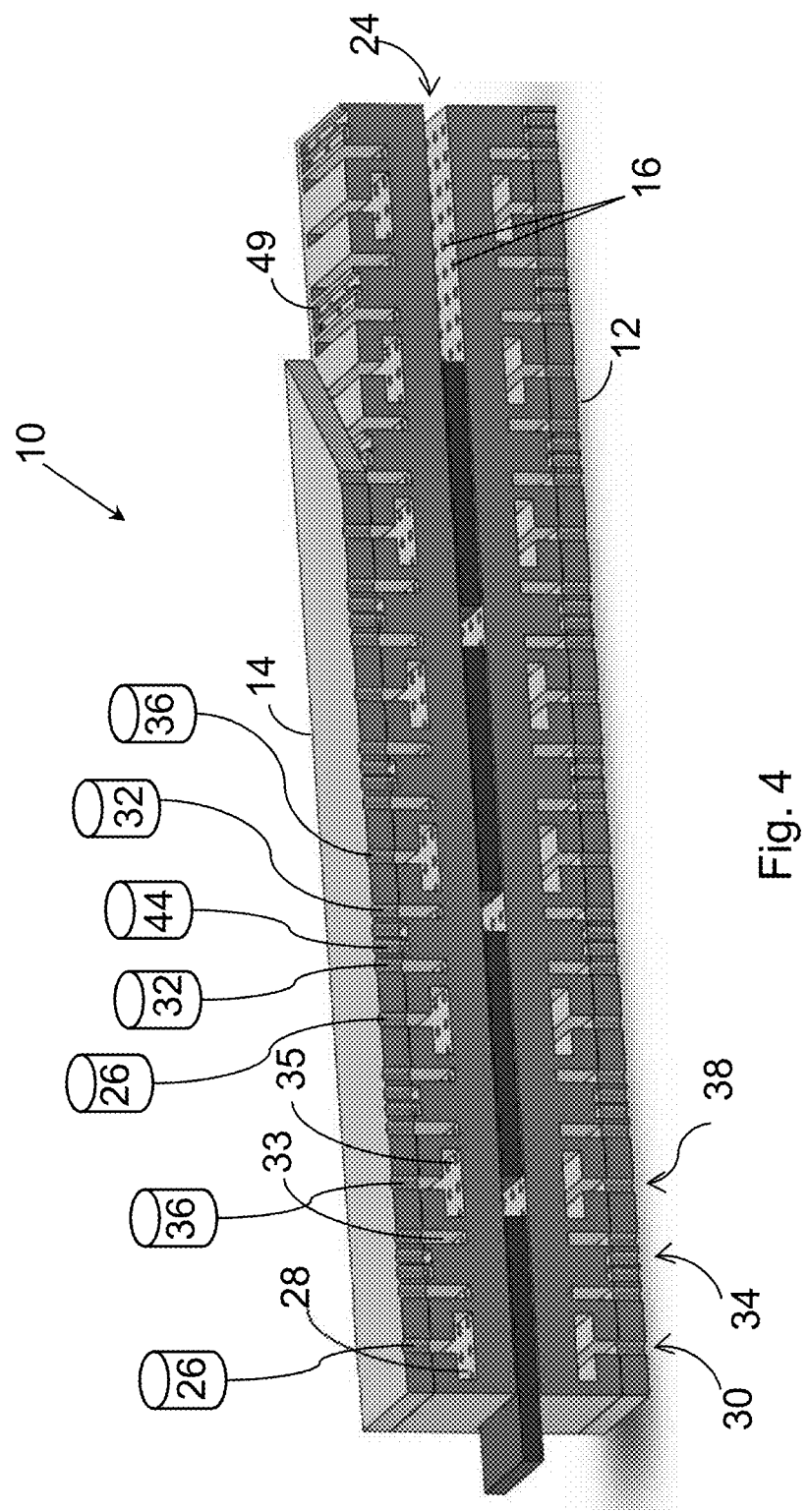
FIG. 4 shows a schematic perspective view of a vertical cross-section of an apparatus according to the invention, wherein a part of the top plate is cut away.
Figure 7:
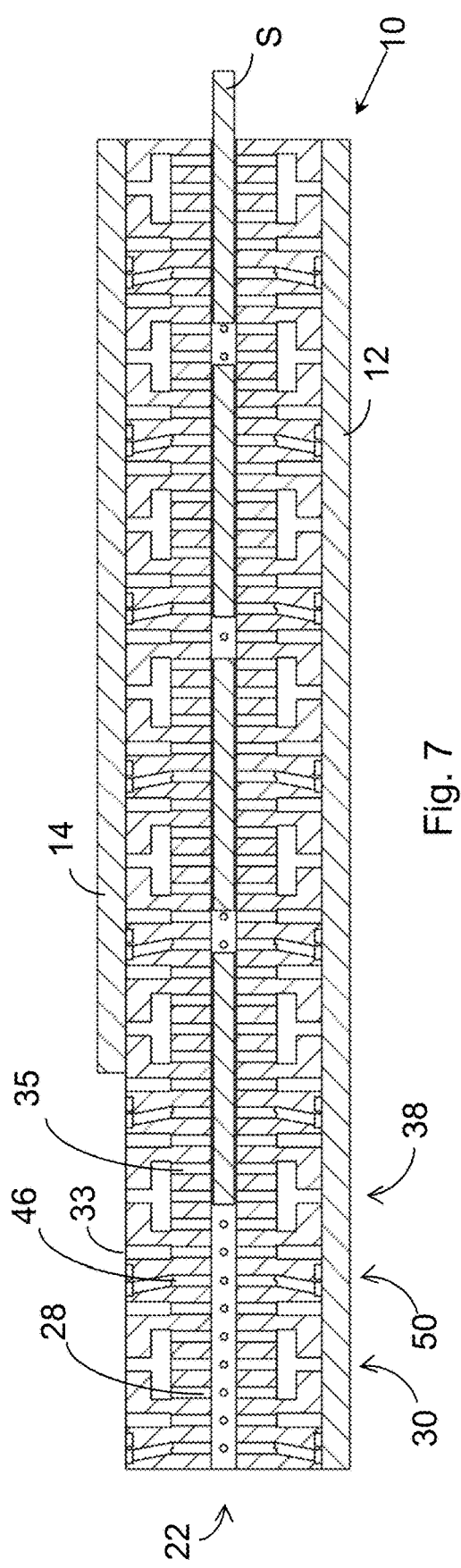
FIG. 7 shows a cross-section along the line B-B of FIG. 5.
Figure 8:
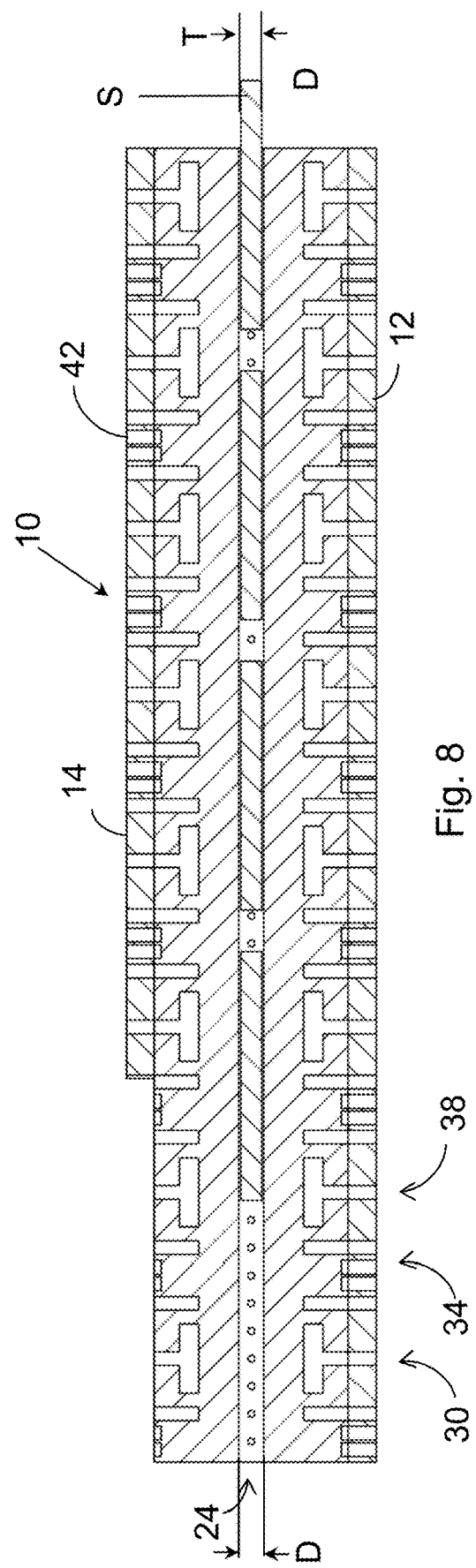
FIG. 8 shows a cross-section along the line C-C of FIG. 5
Figure 9:
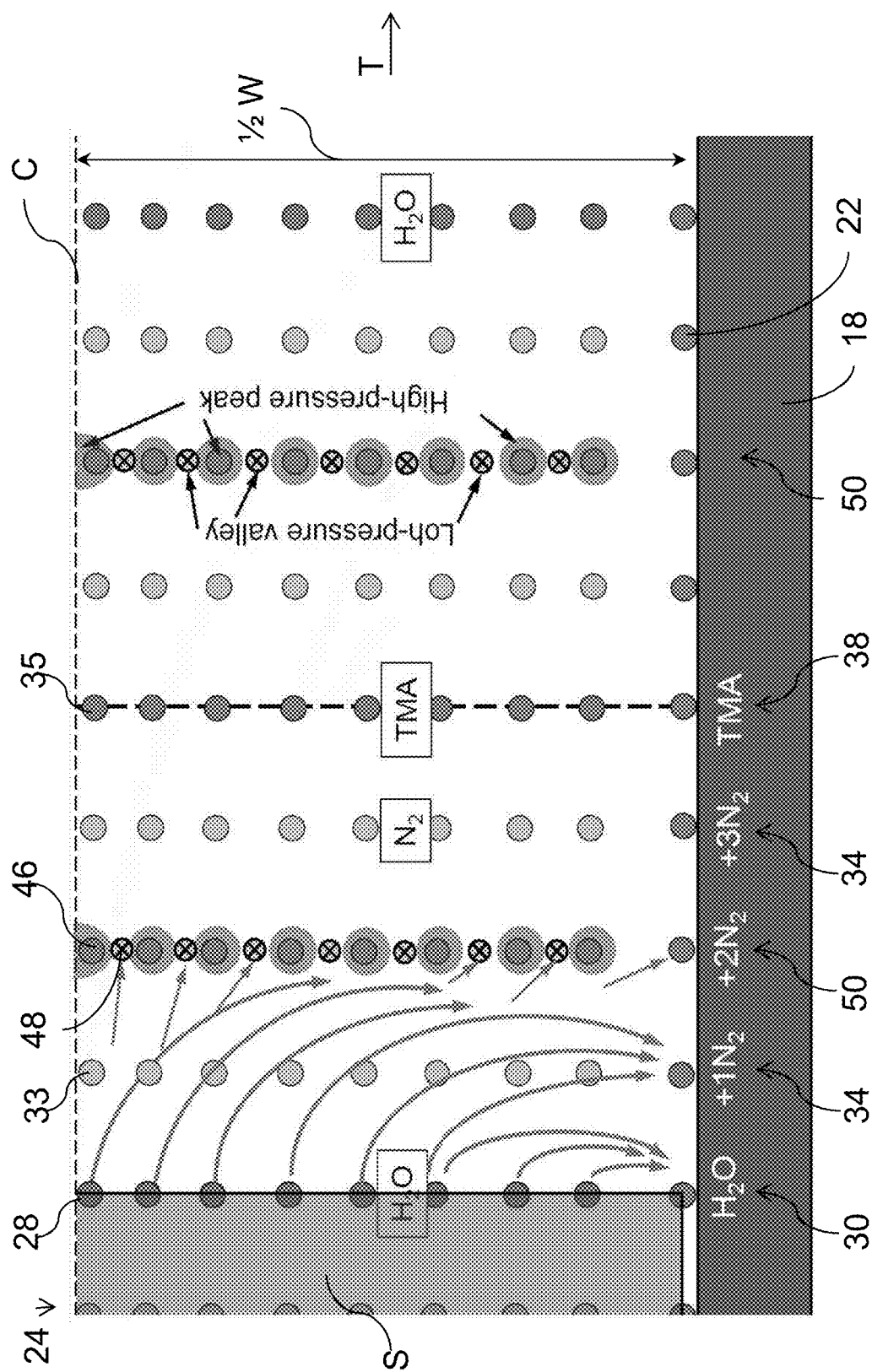
FIG. 9 is a schematic top plan view of the right-hand side of the inside of the process tunnel showing the precursor gas flow in an example of an embodiment.
Figure 10:
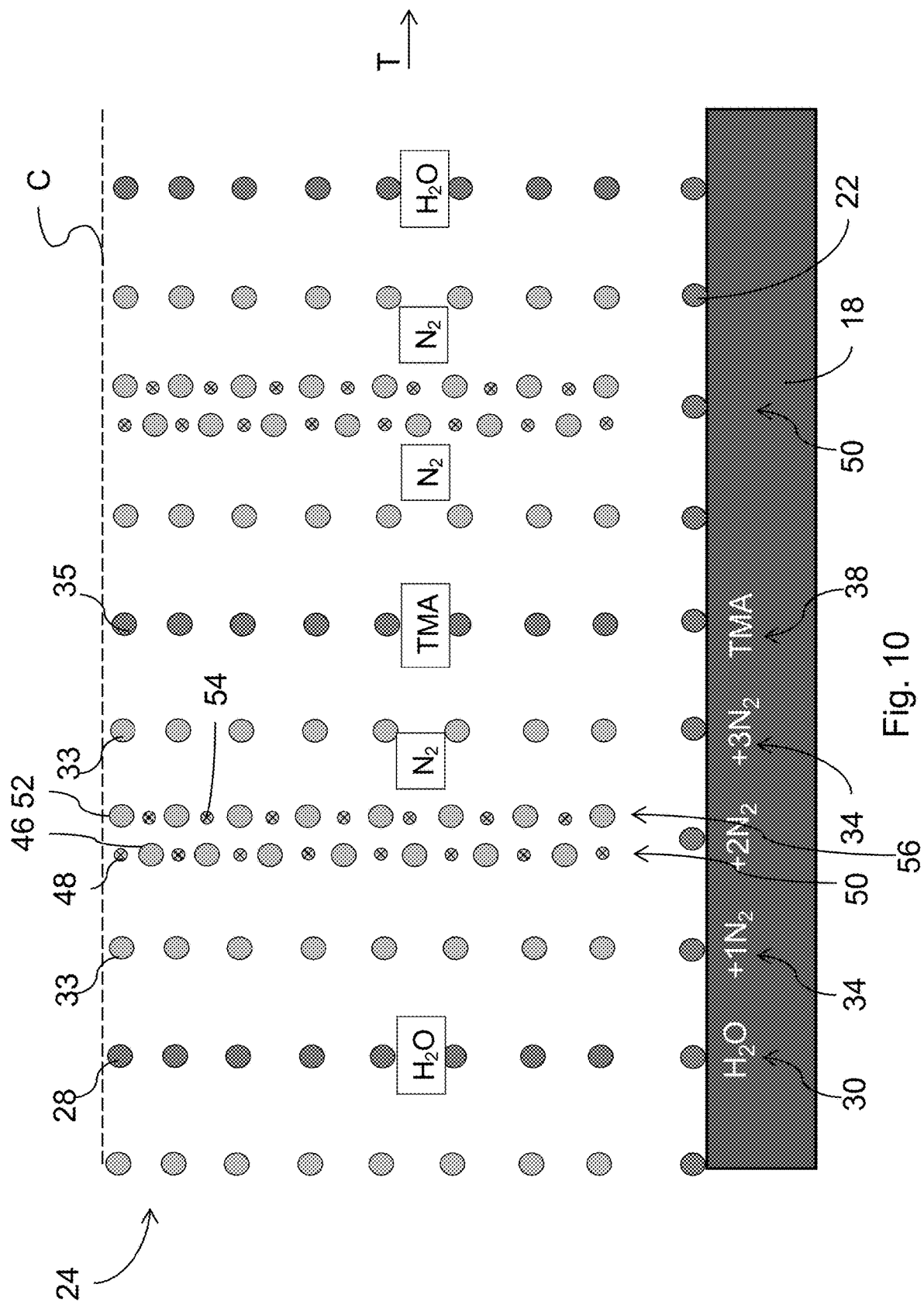
FIG. 10 shows a schematic top plan view of the right-hand side of the inside of a process tunnel of an example of an embodiment having two parallel high pressure/suction zones within each purge zone.

Various embodiments of such an atomic layer deposition apparatus are possible. For example, per precursor zone or purge gas zone one or more transversal rows of gas injection openings may be present. FIG. 1, which represents the prior art, shows five transversal rows of gas injection openings per precursor gas zone and three transversal rows of gas injection openings per purge gas zone. FIGS. 2, 3, and 9 show one row of gas injection openings per precursor gas zone and three rows of gas injection openings per purge gas zone. In the example of FIG. 9, the middle row of the gas injection openings of the purge gas zone includes gas exhaust openings which are intermittently positioned between the gas injection openings. FIGS. 4-8 show three transversal rows of gas injection openings per precursor gas zone and three transversal rows of gas injection openings in the purge gas zones, wherein, in the middle one of these three rows purge gas injection openings gas exhaust openings are intermittently positioned between the gas injection openings. FIG. 10 shows an example in which the precursor gas zones include a single transversal row of gas injection openings whereas the purge gas zones include four transversal rows of gas injection openings. The two middle ones of these four transversal rows include gas exhaust openings which are intermittently positioned between the gas injection openings of that row.

Apart from the gas exhaust openings 48 that are part of the at least one first series of gas exhaust openings, additional gas exhaust openings may be provided. For example, gas exhaust openings 22 may be provided in the first and the second side wall 18, 20 or directly adjacent the first and the second side wall 18, 20 in the upper and/or lower wall.

FIGS. 4-8 clearly show a distribution of a series of high pressure gas injection openings 46 and a series of gas exhaust openings 48 in the apparatus 10 that together form a high pressure/suction zone 50. The advantages of the apparatus have been described in the summary section above to which reference is made.

In particular FIG. 9 depicts a schematic view of the high pressure/suction zone 50 substantially preventing a first precursor gas ($H_2O$) delivered in the first precursor gas zone 30 from traversing the purge gas zone 34 into the second precursor gas zone 38. Although for clarity reasons not depicted in this figure, the high pressure/suction zone 50 also substantially prevents the second precursor gas (TMA) delivered in the second precursor gas zone 38 from traversing the purge gas zone 34 into the first precursor gas zone 30.

In an embodiment of the invention, an example of which is provided in FIG. 10, the upper and/or the lower wall 14, 12 may include a second series of high pressure gas injection openings 52 that may be positioned parallel to the first series of high pressure gas injection openings 46. This second series of high pressure gas injection openings 52 may extend over substantially the entire width of the process tunnel 24 within each purge gas zone 34 and may be connected to the second purge gas source 44. A second series of exhaust openings 54 may be provided parallel to the first series of exhaust openings 48 in at least one of the upper 14 and the lower wall 12. This second series of exhaust openings 54 may be distributed over substantially the entire width of the process tunnel 24 and may be connected to a gas exhaust channel. The second series of high pressure gas injection openings 52 and the second series of exhaust openings 54 may be positioned such that they together may create a second high pressure/suction zone 56 within each purge gas zone 34. The second high pressure/suction zone 56 may be positioned parallel to the first high pressure/suction zone 50 and may extend over substantially the entire width of the process tunnel 24. An example of two adjacent and parallel high pressure/suction zones 50, 56 in the process tunnel is provided in FIG. 10.

The application of a second high pressure/suction zone 56 parallel to a first high pressure/suction zone 50 may provide an improved separation of the gas flows in the process tunnel 24. As described above, gas flows containing precursor gases may exist in both a transport direction T and a direction opposite the transport direction T. Each gas flow may comprise a precursor gas and a purge gas. However, the flows may not contain the same precursor gas. In fact, it may be so that the first flow substantially comprises a mixture of a first precursor gas and a purge gas, whereas the second flow substantially comprises a mixture of a second precursor gas and a purge gas. Applying a second high pressure/suction zone 56 next to a first high pressure/suction zone 50 in a purge gas zone 34 in the process tunnel 24 may essentially provide one high pressure/suction zone for each of the (oppositely directed) gas flows. As this allows both flows to be removed from the process tunnel 24 separately from each other, the chance that the two precursor gases mix is further reduced.

In an embodiment, the gas exhaust channel 49, to which the first series of exhaust openings 48 may be connected, may be separated from the gas exhaust channel, to which the second series of exhaust openings 54 may be connected. This means that, in use, gas exhausted via the first series of gas exhaust openings 48 may comprise substantially a mixture of purge gas and the first precursor gas. The gas exhausted via the second series of gas exhaust openings 54 may comprise substantially a mixture of purge gas and the second precursor gas.

Providing a configuration with two separate exhaust channels 49, may provide several advantages. First of all, an improved separation of the precursor gases is achieved not only in the process tunnel 24, but also during the exhaust of the gases through the exhaust channels. As a result, a reduction of vapor deposition in the exhaust channels 49 may be achieved, which subsequently leads to improved availability of the apparatus 10. Even more so, both separate gas flows may be separately used to regenerate precursor and purge gases from the exhaust gases, increasing the efficiency of the process. In addition, it may be considered to connected the exhaust channels 49 to the lateral exhaust channels in the side walls 18, 20 of the injection zones 30, 38 in order to provide each gas injection zone with a substantially separate exhaust system. Each of these exhaust systems would substantially remove exhaust gas containing a combination of a single precursor gas and purge gas, which could be regenerated to provide precursor and purge gas for the process.

In an embodiment, the distribution of the gas injection openings 46, 52 connected to the second purge gas source 44 and the distribution of the gas exhaust openings 48, 54 within each high pressure/suction zone 50, 56, as well as the pressure of the second purge gas source 44 and the pressure at the gas exhaust openings 48, 54 may be such that, in use, the average pressure within each high pressure/suction zone 50, 56 may be substantially equal to the reference pressure.

The series of high pressure gas injection gas openings 46, 52 may be configured to provide a high pressure flow of purge gas to the process tunnel 24. As a result, a locally increased pressure in the process tunnel 24 may be present, which may have an effect on the forward movement of the substrate S. The series of gas exhaust openings 48, 54 may be configured to remove exhaust gas from the process tunnel 24, therewith locally creating a low pressure region in the process tunnel 24. This may also have an effect on the forward movement of the substrate S in the transport direction T. In order to maintain a substantially smooth, uninterrupted movement by the substrate S, the average pressure in the high pressure/suction zone 50 may be substantially equal to the reference pressure. This may for example be achieved by adapting the pressure of the injected gas to the size of the exhaust openings. This may cause the locally created high and low pressure regions in the high pressure/suction zone to equalize into an average pressure that equals the reference pressure, such that an uninterrupted movement of a substrate may be achieved.

In an embodiment, an example of which is shown in FIG. 9, the first series of high pressure gas injection openings 46 and the first series of exhaust openings 48 within each first high pressure/suction zone 50 may be positioned on a line extending substantially perpendicularly to the transport direction.

By positioning the high pressure gas injection openings 46 and the gas exhaust openings 48 on a line perpendicular to the transport direction, a balanced pressure profile within the high pressure/suction zone 50 across the entire width of the process tunnel 24 is obtained and a sort of extraction curtain is provided that extends over the entire width of process tunnel 24.

In an embodiment, of which an example is shown in FIG. 10, the second series of high pressure gas injection openings 52 and the second series of gas exhaust openings 54 within each second high pressure/suction zone 50 may also be positioned on a line extending substantially perpendicularly to the transport direction.

By providing two high pressure/suction zones 50, 56 parallel to each other an improved separation between the precursor gas zones 30, 38 is obtained.

In an embodiment, a distance H between the lower and the upper wall 12, 14 may be related to a thickness ($T_s$) of the substrate (S) to be processed according to the following formula:

$$1.4T_s < H < 5.0T_s.$$

The apparatus 10 provides gas bearings to floatingly support the substrate S within the process tunnel 24. These gas bearings may only be present in a process tunnel 24, wherein the lower and the upper wall 12, 14 are disposed relatively close to one another. However, as substrates S may vary in thickness $T_s$ and the apparatus may be designed for processing various thicknesses $T_s$, the distance H may be dependent on the thickness $T_s$ of the substrate S. Since the distance H and the distance between the substrate S and the lower and upper wall 12, 14 may determine not only the characteristics of the gas bearings, but may also have an effect on the pressure gradient within the process tunnel 24, the relation between the thickness $T_s$ and the distance H has an effect on the gas flows within the process tunnel 24. With a height/thickness ratio within the range according to this embodiment, the stability of the gas bearings between the walls of the tunnel and the substrates is optimized.

In an embodiment, the first precursor gas may be water ($H_2O$).

In an embodiment, the second precursor gas may be tri-methyl aluminum (TMA).

These precursor gases may, for example, be used in the production of photovoltaic cells based on silicon wafers. Naturally, other precursor gases may be used for depositing atomic layers.

In an embodiment, the purge gas may be nitrogen ($N_2$).

The invention also provides a substrate processing apparatus 210, that may be, but does not have to be an atomic layer deposition apparatus. The apparatus 210 in general comprises a lower wall 212, including a plurality of gas injection openings, and an upper wall, extending parallel to the lower wall 212, including a plurality of gas injection openings. The apparatus 210 also comprises a first and a second side wall 218, 220, extending substantially perpendicularly relative to the lower wall 212. The lower wall 212, the upper wall and the first and the second side walls 218, 220 bound a process tunnel 224 having a length extending in a transport direction G and defining a longitudinal axis C extending in a vertical middle plane that is positioned centrally between the first 218 and the second 220 side wall and extending in a horizontal middle plane that is position centrally between the lower and the upper wall 212. The apparatus 210 additionally includes a gas source connected to the gas injection openings, a plurality of gas exhaust openings 222 that are arranged in the lower wall 212 and the upper wall and an exhaust channel that is in fluid connection with the gas exhaust openings 222. In use:

the distribution of the gas injection openings in the lower wall 212 and the upper wall, the distribution of the gas exhaust openings 222 in the lower wall 212 and/or the upper wall, a ratio between a thickness of a substrate to be processed and a distance D between the lower wall 212 and the upper wall, the supply of gas through the gas injection openings, and the exhaust of gas through the exhaust openings 222 are such that gas bearings are formed above and below a substrate $S_u$ that is present in the process tunnel 224. The plurality of gas injection openings in the upper wall and/or the lower wall 212 includes subsets of gas injection openings 228. Each subset 228 is positioned on a line SL having a length and a thickness. The line SL extends along a direction that includes an angle α with the transport direction G between 0° and 90°. The plurality of gas exhaust openings 222 includes subsets of gas exhaust openings 230. With each subset of gas injection openings 228 a said subset gas exhaust openings 230 is associated. The gas exhaust openings 230 of that subset are positioned on the line SL on which the gas injection openings 228 of the associated gas injection opening subset 228 are positioned. These gas exhaust openings 230 are intermittently positioned between the gas injection openings 228, such that, in use, the gases flowing from the gas injection openings to the adjacent gas exhaust openings of the same subset exert a drag force on the substrate resulting in a forward movement and/or rotational movement of the substrate.

The advantages of the apparatus 210 have been described in the summary section, to which reference is made. Examples of the apparatus 210 have been provided in FIGS. 11-13. A plurality of subsets of gas injection openings 228 and the associated subsets of gas exhaust openings 230 may be placed in various configurations. By virtue of the configuration of the subsets 228, 230 a combination of various effects may be provided on the movement of the substrate $S_u$ in the process tunnel 224, which can not be obtained using an apparatus according to the prior art. The most important effect being that the resultant drag force may impart a movement from the substrate along the transport direction and/or a rotational movement to the wafer. This movement along the transport direction and/or the rotational movement can be effected without touching the wafers with mechanical means such as actuators and also without positioning the tunnel under an angle with the horizontal to create a gravity drive. Especially when the weight of the substrates is relatively large, which is the case for larger substrates such as substrates having a diameter of >400 mm and a thickness of approximately 800 μm, the angle with the horizontal must be very small to obtain a feasible gravity drive, typically in the order of less than 0.5°. When the angle with the horizontal were larger, the speed of the substrates would become to high. When a rotational movement is imparted, the substrates will generally be circular, which is customary for the production of wafers for integrated circuits.

As noted before, the line SL may have a certain thickness so that the centers of the gas injection openings and the centers of the gas exhaust openings do not all have to be exactly on a mathematical line. The line may have a thickness in the order of some millimeters for example 0-4 mm and consequently, the centers gas injection openings and the gas exhaust openings may be positioned somewhat staggered relative to each other as long as they are positioned within the thickness of the line SL.

In an embodiment of the apparatus 210, the angle α complies with 60°≤α<90°, and preferably complies with 70°≤α≤80°.

When the angle α is within these ranges, a drag force component in the transport direction G or opposite the transport direction G is obtained that is large enough to create a rotation or a forward movement with a sufficient speed, while still maintaining a flow of which the speed component that is transversal to the transport direction is large enough to create transversally extending zones of which the gases may, when desired, be substantially kept separated by intermediate transversally extending zones.

In an embodiment, a said line SL, when viewed in the transport direction G, may extend substantially over the entire width U of the upper wall and/or the lower wall 212, such that the resultant drag force imparts, in use, a rotation to the substrate, and such that the resultant drag force in a direction perpendicular to the transport direction is zero.

Figure 11:
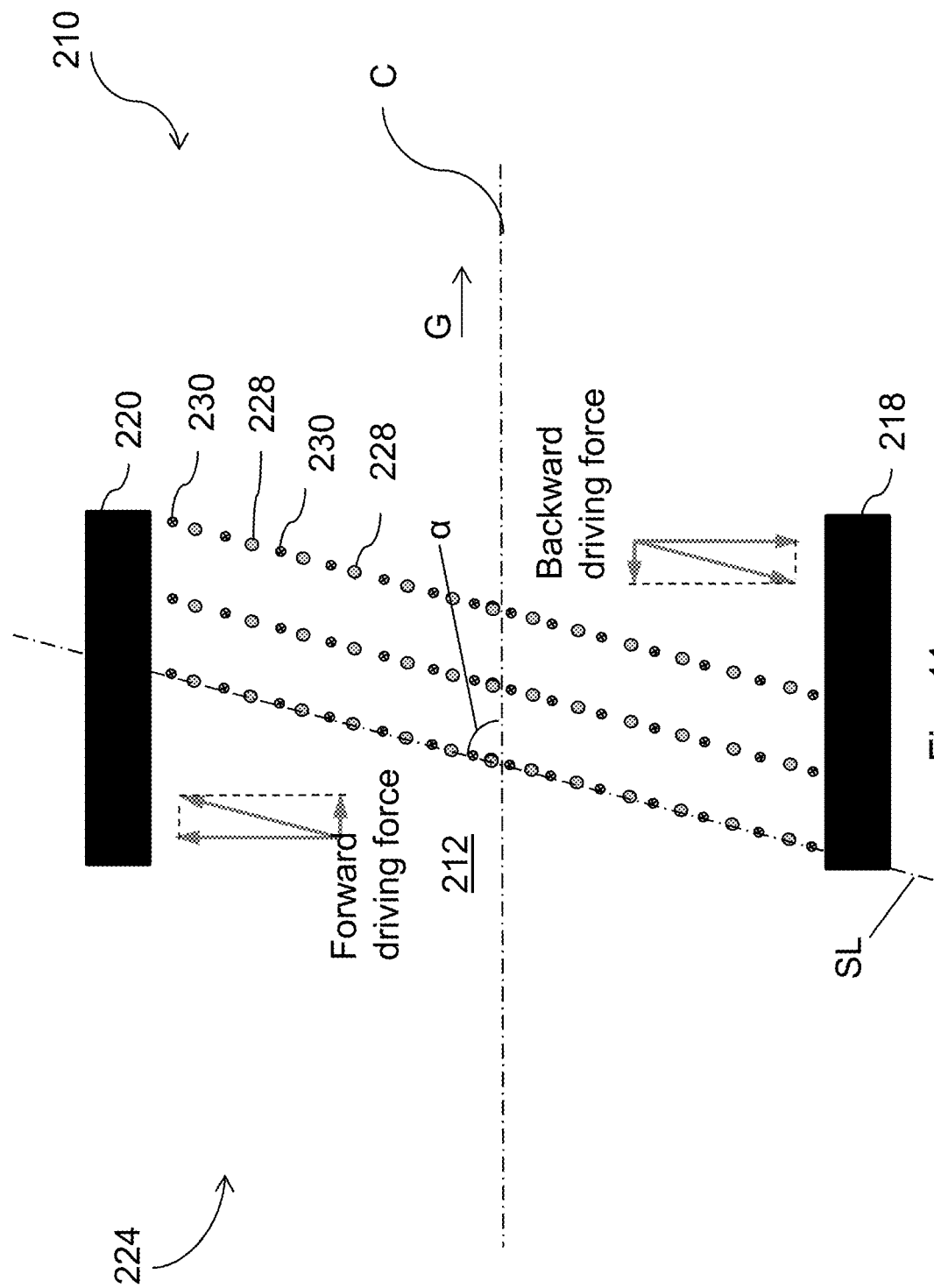
FIG. 11 shows a part of a process tunnel over its entire width, wherein subsets of gas injection openings and gas exhaust openings are arranged to provide a rotation.
Figure 12:
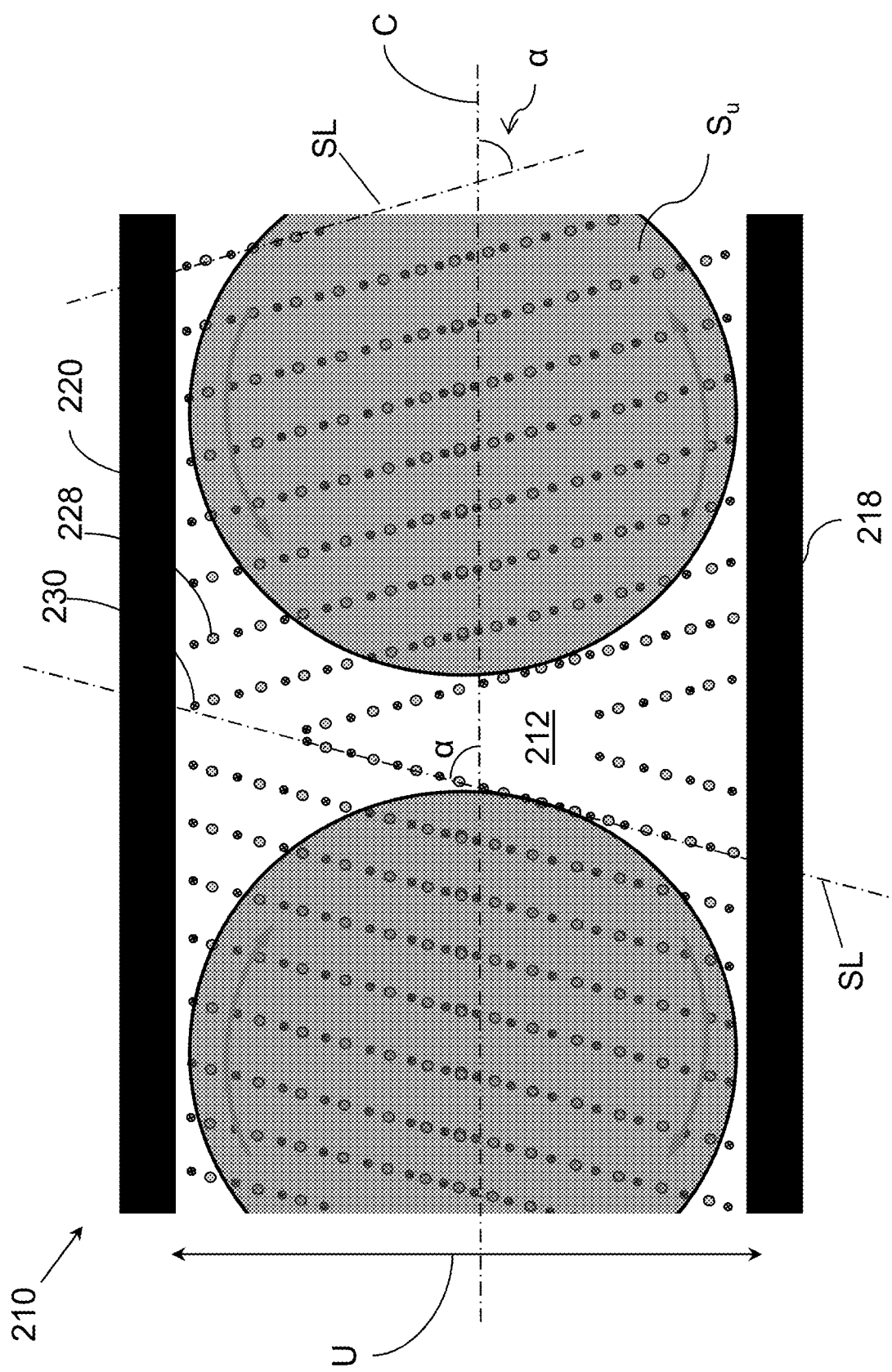
FIG. 12 shows a part of a process tunnel over its entire width indicating the rotation imparted to the substrates.

The embodiment, an example of which is shown in FIG. 11, may, when viewed from above, provide a clockwise rotation to a substrate $S_u$ accommodated in the process tunnel. When the angle α is on the other side of the vertical middle plane, the drag forces will provide a counter clockwise rotation to a substrate $S_u$, when viewed from above. A combination of the two examples is also feasible and is shown in FIG. 12. This will impart a rotation to the substrate $S_u$ in two opposite directions in different longitudinal sections of the process tunnel 224.

Imparting rotation to the substrates may be advantageous to obtain a more uniform processing of the surfaces of the substrates $S_u$. Even if, for example, the gas concentration is not completely equal over the width of the process tunnel, then the layers formed on the wafer will have a uniform structure by virtue of the rotation that has been imparted to the substrate. Also when annealing, a non-uniform temperature profile over the width of the process tunnel 224 is not detrimental for the quality uniformity of the annealing effect over the entire area of the substrate surface when the substrates are rotating. In view thereof, being able to rotate a substrate within a process tunnel 224 is a substantial advantage.

In an embodiment, a said line SL may, when viewed in the transport direction G, extend from the vertical middle plane laterally towards the first side wall 218 and in the transport direction G. The line SL may have a first end point in the vertical middle plane and a second end point adjacent the first side wall 218. Another said line SL may, when viewed in the transport direction G, extend from the vertical middle plane laterally towards the second side wall 220 and in the transport direction G. The line SL may have a first end point in the vertical middle plane and a second end point adjacent the second side wall 220. Such a configuration, will, in use, produce a resultant drag force on the substrate that imparts a forward or a backward movement to the substrate. The resultant drag force in a direction perpendicular to the transport direction will be zero.

Figure 13:
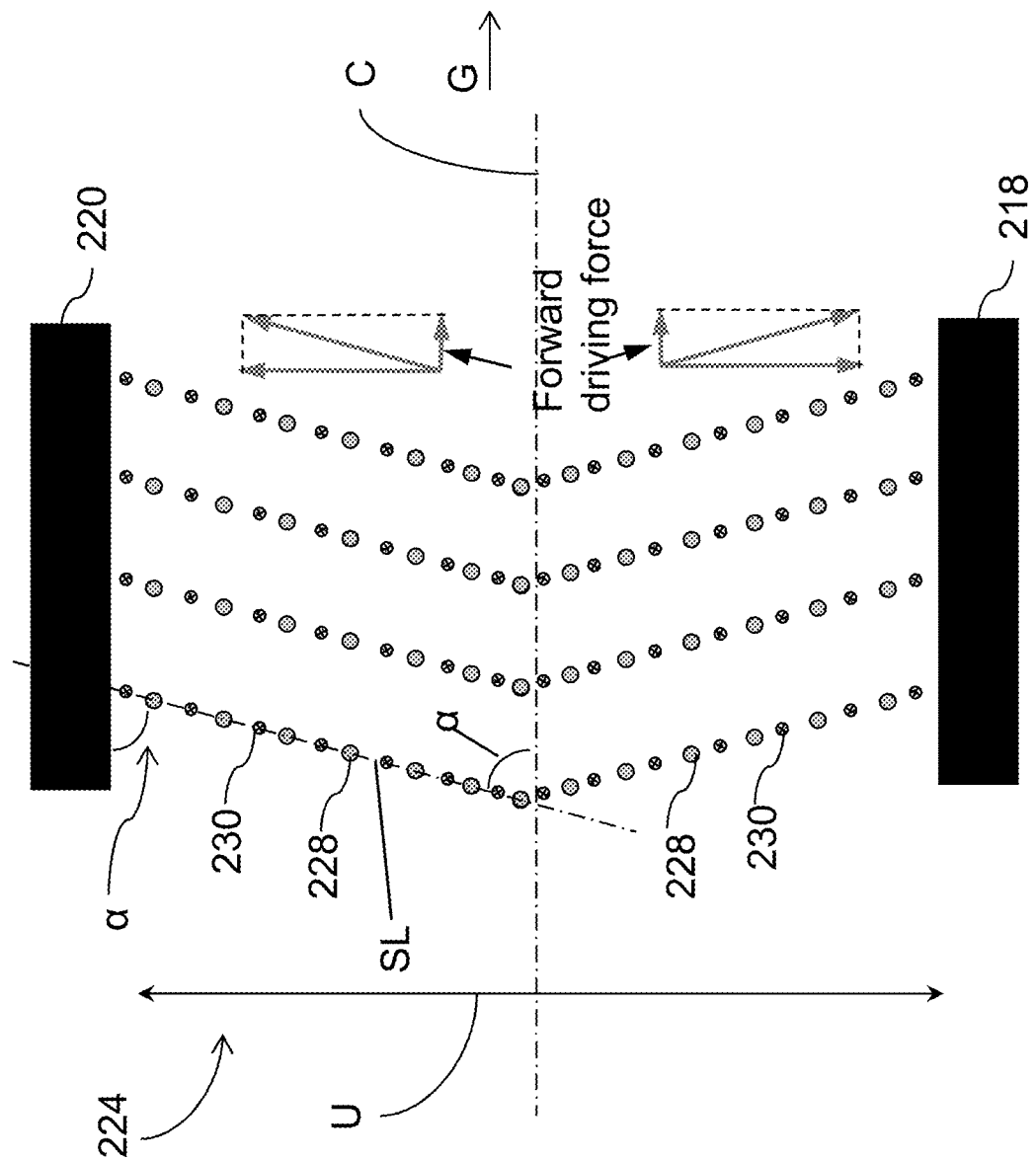
FIG. 13 shows a part of a process tunnel over its entire width, wherein subsets of gas injection openings and gas exhaust openings are arranged to provide a forward driving force.

An example of this embodiment is shown in FIG. 13. This embodiment is advantageous in that it may be used for propelling substrates $S_u$ along the transport direction G either forward or backward dependent on the angle α. In addition, the substrate may exhibit an increased lateral stability with regard to the side walls 218, 220 of the process tunnel 224. The symmetry may provide a substantially equal flow of injected gas in the direction of two opposite side walls 218, 220, while still imparting a drag force on the substrates $S_u$ to propel the substrate $S_u$ in the transport direction G. Furthermore, by controlling the flow of gas that may be injected into the process tunnel, the embodiment may also be used to provide an increase or decrease in the speed of the substrate $S_u$ in the transport direction G.

Figure 14:
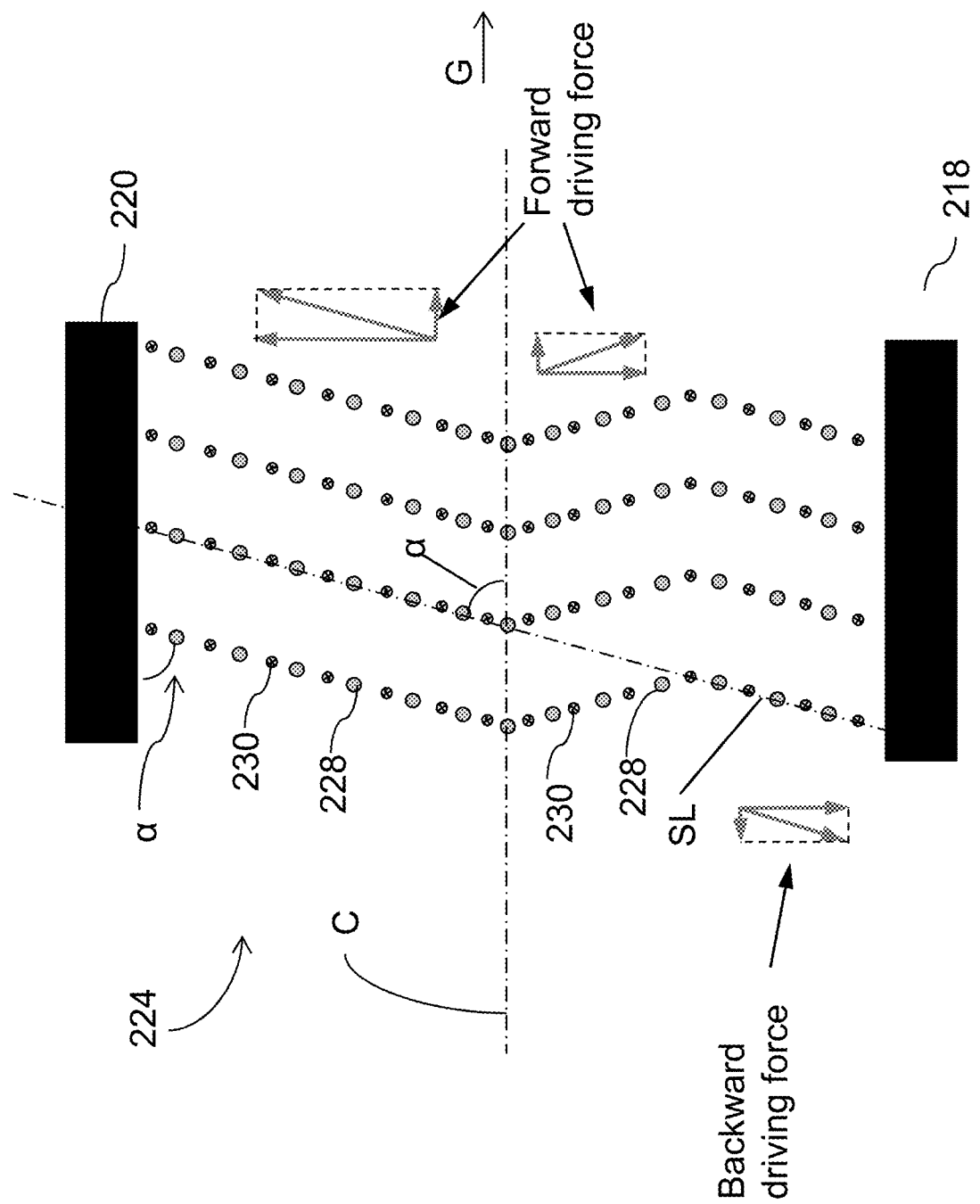
FIG. 14 shows a part of another process tunnel over its entire width, wherein subsets of gas injection openings and gas exhaust openings are arranged to impart both forward/backward movement and rotational movement to a substrate.

In an embodiment, of which an example is shown in FIG. 14, the length of a said line SL does not span the entire width of the associated upper or lower wall, 212. For spanning the entire width of the upper or lower wall, a group of lines (SL) is associated with each other. Some of the lines of the group include an angle α with the right side of the vertical middle plane whereas at least one other line of the group includes an angle α with the left side of the vertical middle plane. The total length of the lines that include an angle α with the right side of the vertical middle plane is different from the total length of the lines that include an angle α with the left side of the vertical middle plane. By consequence, the resultant drag force imparts a forward or backward movement to the substrate as well as a rotational movement to the substrate. This configuration also ensures that the resultant drag force in a direction perpendicular to the transport direction is zero.

Such an embodiment is very advantageous because it will impart both a rotation and a forward or backward movement to a substrate. The rotation will increase the uniformity of the treatment of the substrate and speed of the forward or backward movement may be chosen as desired without being dependent on other mechanical drive means, such as mechanical actuators and without having to position the tunnel under an angle with the horizontal to provide a gravity drive.

In an embodiment, the substrate processing apparatus 210 may be embodied as an atomic layer deposition apparatus. To that end, the substrate processing apparatus may additionally include a first precursor gas source connected to series of gas injection openings of the plurality of gas injection openings. This may create first precursor gas injection zones that may extend over substantially the entire width U of the process tunnel and that may be spatially arranged along the transport direction G of the process tunnel 224. It also may include a purge gas source connected to series of gas injection openings of the plurality of gas injection openings. This may create purge gas injection zones that may extend over substantially the entire width U of the process tunnel 224 and that may be spatially arranged along the transport direction G of the process tunnel 224. Furthermore, the apparatus may include a second precursor gas source connected to series of gas injection openings of the plurality of gas injection openings. This may create second precursor gas injection zones that may extend over substantially the entire width U of the process tunnel 224 and that may be spatially arranged along the transport direction G of the process tunnel 224. The connections of the first precursor gas source, the purge gas source and the second precursor gas source to the respective gas injection openings are such that a plurality of successive process sections is created in the process tunnel 224 along the transport direction G. Each process section includes successively a first precursor gas injection zone, a purge gas zone, a second precursor gas injection zone, and a purge gas zone.

The process sections may advantageously be used in an atomic layer deposition apparatus 210, depositing successive atomic layers on the substrate $S_u$. An arrangement of gas zones may be provided, which for example successively introduce tri-methyl aluminum (TMA) in the first precursor zone, purge gas nitrogen ($N_2$) in the purge gas zone, water vapor ($H_2O$) in the second precursor gas zone and nitrogen ($N_2$) in the subsequent purge gas zone. Of course, the gases are examples and may also be chosen to be any other suitable gas and may also be chosen in accordance with the desired layer structure that is to be placed on the substrate $S_u$. Other suitable gases may be $HfCl_4$ or $ZrCl_4$. It is noted that successive process sections may be provided, with each process section providing a different arrangement of gases. This may allow the apparatus 210 to be tailored to provide atomic layers to be arranged on the substrate in a specific sequence. Each of upper and/or the lower wall of the successive gas injection zones, of each process section may be provided with one or more subsets of gas injection openings 228 and gas exhaust openings 230.

In an embodiment, of which examples are shown in FIGS. 11-14, each first precursor gas injection zone, each purge gas zone and each second precursor gas injection zone may include at least one of said subsets of gas injection openings 228 that is positioned on a said line SL and at least one of said associated subsets of gas exhaust openings 230 that is positioned intermittently between the gas injection openings 228, such that, in use, the gases flowing from the gas injection openings to the adjacent gas exhaust openings of the same subset exert a drag force on the substrate resulting in a forward movement and/or rotational movement of the substrate.

With such a configuration, the drag force is not only produced in the purge gas zones but will be produced in every gas zone, i.e. in the precursor gas zones and the purge gas zones.

The invention also provides a method for depositing a layer on a substrate S. The method comprises providing an atomic layer apparatus according to any one of claims 1-10 and providing at least one substrate S. It furthermore comprises injecting gas in the process tunnel 24 through the gas injection openings 16 and introducing the at least one substrate S in the process tunnel 24. As a result, gas bearings are formed above and below the substrate S. The method further comprises subjecting at least one surface of the substrate S to an atomic layer deposition process. This process comprises injecting a first precursor gas into the first precursor gas zones 30 to deposit a first layer on the substrate S and injecting a second precursor gas into the second precursor gas zones 38 to deposit a second layer on the substrate S. It also comprises injecting purge gas into each purge gas zone 34 using the series of high pressure gas injection openings 46, while simultaneously exhausting gas from the process tunnel 24 through the series of gas exhaust openings 48, thus forming a first high pressure/suction zone 50. The first high pressure/suction zone 50 extends over substantially the entire width W of the process tunnel 24. The first high pressure/suction zone 50 substantially prevents the first precursor gas from the first precursor gas zone 30 from traversing the adjacent purge gas zone 34 into the second precursor gas zone 38. Simultaneously the first high pressure/suction zone 50 prevents the second precursor gas from the second precursor gas zone 38 from traversing the purge gas zone 34 into the first precursor gas zone 30. The method also comprises controlling a pressure of the first precursor gas source 26, the purge gas source 32, the second precursor gas source 36, and the second purge gas source 44 as well as controlling a pressure at the gas exhaust openings 48. The controlling is such that an average pressure within the first high pressure/suction zone 50 deviates less than 30%, preferably less than 10%, and preferably less than 5%, from a reference pressure which is defined by the average pressure within the first precursor gas zones 30, the second precursor gas zones 38 and the purge gas zones 34 when no substrate is present.

As mentioned in the summary section, an advantage of the method is that forming the high pressure/suction zone 50 substantially prevents precursor gases from a precursor zone from traversing a purge gas zone into a different precursor zone. Reference is also made to FIG. 9, which clearly shows the effect of the high pressure/suction zone 50 on the flow of precursor gas that flows in the direction of the purge gas zone 34.

The invention also provides a method for processing substrates in substrate processing apparatus according to any one of claim 11-17. The method comprises providing an atomic layer deposition apparatus (210) according to the invention and providing at least one substrate $S_u$. The method furthermore comprises injecting gas in the process tunnel 224 through the subsets of gas injection openings 228 and simultaneously exhausting gas from the associated subsets of gas exhaust openings 230. In addition, the method comprises introducing the at least one substrate $S_u$ in the process tunnel 224, by which gas bearings are formed above and below the substrate $S_u$ and by which the injected gas causes transportation of the substrate $S_u$ in the transport direction G and/or a rotation of the substrate $S_u$.

As referred to in the summary section, the method has the advantage that it may both propel the substrate $S_u$ forward in the transport direction G as well as provide it with a rotation. As such, the method may be used in various processes involving substrates $S_u$. This may for example concern subjecting substrates $S_u$ to an atomic layer deposition process. The method may also be used for other suitable purposes, for example, annealing of substrates.

The various embodiments which are described above may be used implemented independently from one another and may be combined with one another in various ways. The reference numbers used in the detailed description and the claims do not limit the description of the embodiments nor do they limit the claims. The reference numbers are solely used to clarify.

LEGEND

10—atomic layer deposition apparatus
12—lower wall
14—upper wall
16—gas injection opening
18—first side wall
20—second side wall
22—gas exhaust opening
24—process tunnel
26—first precursor gas source
28—series of first precursor gas injection openings
30—first precursor gas injection zone
32—purge gas source
33—series of purge gas injection openings
34—purge gas injection zone
35—series of second precursor gas injection openings
36—second precursor gas source
38—second precursor gas injection zone
40—process section
44—second purge gas source
46—first series of high pressure gas injection openings
48—first series of gas exhaust openings
49—gas exhaust channel
50—high pressure/suction zone
51—gas exhaust channel
52—second series of high pressure gas injection openings
54—second series of gas exhaust openings
56—second high pressure/suction zone
D—distance between lower and upper wall
S—substrate
T—transport direction of substrate(s)
$T_s$—thickness of a substrate
W—width of the process tunnel
210—atomic layer deposition apparatus
212—lower wall
218—first side wall
220—second side wall
224—process tunnel
228—subset of gas injection openings
230—subset of gas exhaust openings
$S_u$—substrate
U—process tunnel width
G—transport direction
C—Longitudinal axis of the process tunnel

The invention claimed is:
1. A substrate processing apparatus, comprising:
a lower wall including a plurality of gas injection openings;
an upper wall extending parallel to the lower wall including a plurality of gas injection openings;
a first and a second side wall extending substantially perpendicularly relative to the lower wall;
wherein the lower wall, the upper wall and the first and the second side walls bound a process tunnel having a length extending in a transport direction and having a width extending transversally to the transport direction and defining a longitudinal axis extending in a vertical middle plane that is positioned centrally between the first and the second side wall and extending in a horizontal middle plane that is position centrally between the lower and the upper wall;
the apparatus additionally including:
a gas source connected to the gas injection openings;
a plurality of gas exhaust openings that are arranged in the lower wall and the upper wall;
an exhaust channel that is in fluid connection with the gas exhaust openings;
wherein the distribution of the gas injection openings in the lower wall and the upper wall,
the distribution of the gas exhaust openings in the lower wall and/or the upper wall, a ratio between a thickness of a substrate to be processed and a distance between the lower wall and the upper wall, the flow rate of gas supplied through the gas injection openings, and the flow rate of exhaust of gas through the exhaust openings are such that, in use gas bearings are formed above and below a substrate that is present in the process tunnel; and
wherein in the upper wall and/or the lower wall the plurality of gas injection openings includes subsets of gas injection openings,
wherein the gas injection openings of a said subset of gas injection openings are positioned on an imaginary line segment associated with the subset of gas injection openings and having a length,
wherein each imaginary line segment extends in the upper wall and/or the lower wall in which the gas injection openings of the associated subset are included,
wherein an angle α with the transport direction complies with 60°≤α<90°, and preferably complies with 70°≤α≤80°, wherein the plurality of gas exhaust openings includes subsets of gas exhaust openings, wherein each subset of gas exhaust openings is associated with an associated subset of gas injection openings, wherein the gas exhaust openings of a respective subset of said subsets of gas exhaust openings are on the same imaginary line segment as the gas injection openings of the subset of gas injection openings which is associated with the respective subset of said subsets of gas exhaust openings, wherein the gas exhaust openings are intermittently positioned between the gas injection openings of the subset of gas injection openings which is associated with the respective subset of gas exhaust openings, such that, in use, the gases flowing from the gas injection openings which are on a said imaginary line segment to the adjacent gas exhaust openings on the same imaginary line segment exert a drag force on the substrate resulting in a forward movement and/or rotational movement of the substrate.

2. The substrate processing apparatus according to claim 1, wherein a said imaginary line segment extends substantially over the entire width of the upper wall and/or the lower wall, such that the resultant drag force imparts, in use, a rotation to the substrate, and such that the resultant drag force in a direction perpendicular to the transport direction is zero.

3. The substrate processing apparatus according to claim 1, wherein the process tunnel defines a vertical middle plane which extends vertically and is positioned centrally between the first and the second side wall, wherein a first one of said imaginary line segments, when viewed in the transport direction, extends from the vertical middle plane laterally towards the first side wall and in the transport direction and has a first end point in the vertical middle plane and a second end point adjacent the first side wall, wherein a second one of said imaginary line segments, when viewed in the transport direction, extends from the vertical middle plane laterally towards the second side wall and in the transport direction and has a first end point in the vertical middle plane and a second end point adjacent the second side wall, such that, in use, the resultant drag force imparts a forward or a backward movement to the substrate, and such that the resultant drag force in a direction perpendicular to the transport direction is zero.

4. The substrate processing apparatus according to claim 1, wherein the process tunnel defines a vertical middle plane which extends vertically and is positioned centrally between the first and the second side wall, wherein the length of any one of the said imaginary line segments does not span the entire width of the associated upper or lower wall, and wherein a group of imaginary line segments associated with each other span the entire width of the upper or lower wall, wherein some of the imaginary line segments of the group are at an angle α with the right side of the vertical middle plane whereas at least one other imaginary line segment of the group is at an angle α with the left side of the vertical middle plane, wherein the total length of the lines that include an angle α with the right side of the vertical middle plane is different from the total length of the lines that include an angle α with the left side of the vertical middle plane, such that the resultant drag force imparts a forward or backward movement to the substrate as well as a rotational movement to the substrate, and wherein the resultant drag force in a direction perpendicular to the transport direction is zero.

5. The substrate processing apparatus according to claim 1, the apparatus additionally including:

a first precursor gas source connected to series of gas injection openings of the plurality of gas injection openings so as to create first precursor gas injection zones that extend over substantially the entire width of the process tunnel and that are spatially arranged along the transport direction of the process tunnel;

a purge gas source connected to series of gas injection openings of the plurality of gas injection openings so as to create purge gas injection zones that extend over substantially the entire width of the process tunnel and that are spatially arranged along the transport direction of the process tunnel;

a second precursor gas source connected to series of gas injection openings of the plurality of gas injection openings so as to create second precursor gas injection zones that extend over substantially the entire width of the process tunnel and that are spatially arranged along the transport direction of the process tunnel;

wherein the connections of the first precursor gas source, the purge gas source and the second precursor gas source to the respective gas injection openings are such that a plurality of successive process sections is created in the process tunnel along the transport direction, wherein each process section includes successively a first precursor gas injection zone, a purge gas zone, a second precursor gas injection zone, and a purge gas zone.

6. The substrate processing apparatus according to claim 5, wherein each first precursor gas injection zone, each purge gas zone and each second precursor gas injection zone includes at least one of said subsets of gas injection openings that is positioned on a said line and at least one of said associated subsets of gas exhaust openings positioned intermittently between the gas injection openings, such that, in use, the gases flowing from the gas injection openings to the adjacent gas exhaust openings of the same subset exert a drag force on the substrate resulting in a forward movement and/or rotational movement of the substrate.

* * * * *